(12) United States Patent
Usui et al.

(10) Patent No.: US 11,360,606 B2
(45) Date of Patent: Jun. 14, 2022

(54) CONTROL CIRCUIT OF RESISTIVE TOUCH PANEL

(71) Applicant: ROHM CO., LTD., Kyoto (JP)

(72) Inventors: Hirotoshi Usui, Kyoto (JP); Naoki Tada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/930,923

(22) Filed: Jul. 16, 2020

(65) Prior Publication Data

US 2020/0348819 A1  Nov. 5, 2020

Related U.S. Application Data

(63) Continuation of application No. PCT/JP2019/001018, filed on Jan. 16, 2019.

(30) Foreign Application Priority Data

Jan. 19, 2018 (JP) .............................. JP2018-007455

(51) Int. Cl.
  *G06F 3/041*  (2006.01)
  *G06F 3/045*  (2006.01)
(52) U.S. Cl.
  CPC .......... *G06F 3/04186* (2019.05); *G06F 3/045* (2013.01); *G06F 2203/04104* (2013.01)
(58) Field of Classification Search
  None
  See application file for complete search history.

(56) References Cited

U.S. PATENT DOCUMENTS

| | | | | |
|---|---|---|---|---|
| 10,318,058 B2* | 6/2019 | Usui | ....................... | G06F 3/045 |
| 2013/0277192 A1* | 10/2013 | Nakajima | .............. | H01H 13/52 |
| | | | | 200/512 |
| 2017/0293397 A1* | 10/2017 | Usui | ..................... | G06F 3/0418 |

FOREIGN PATENT DOCUMENTS

| JP | H10260769 A | 9/1998 |
|---|---|---|
| JP | 2008097494 A | 4/2008 |

(Continued)

OTHER PUBLICATIONS

International Preliminary Report on Patentabilty for International Application PCT/JP2019/001018; dated Jul. 30, 2020.

(Continued)

*Primary Examiner* — Amare Mengistu
*Assistant Examiner* — Sarvesh J Nadkarni
(74) *Attorney, Agent, or Firm* — Cantor Colburn LLP

(57) ABSTRACT

A control circuit controls a two-wire resistive touch panel. The two-wire resistive touch panel includes a first region and a second region which are adjacent to each other in a coordinate axis direction (X direction), and the first region has resistance per unit length lower than resistance per unit length of the second region. A measurement unit measures an electric signal having a correlation with impedance between two wires which are lead out from the resistive touch panel. A processing unit (i) determines that the first region is touched when the electric signal or the impedance obtained from the electric signal is included in a predetermined first range, (ii) determines that the second region is touched when the electric signal or the impedance obtained from the electric signal is included in a predetermined second range, and generates a touched coordinate.

5 Claims, 14 Drawing Sheets

(56) References Cited

FOREIGN PATENT DOCUMENTS

| | | |
|---|---|---|
| JP | 2009048233 A | 3/2009 |
| JP | 2010262503 A | 11/2010 |
| JP | 5086394 B2 | 11/2012 |
| JP | 2017188019 A | 10/2017 |

OTHER PUBLICATIONS

International Seach Report for International Application No. PCT/JP2019/001018; dated Mar. 12, 2019.
JPO Notice of Reasons for Refusal for corresponding JP Application No. 2019-566478; dated Jan. 26, 2021.

* cited by examiner

CONTROL CIRCUIT OF RESISTIVE TOUCH PANEL

CROSS REFERENCE TO RELATED APPLICATIONS

This application is a continuation under 35 U.S.C. § 120 of PCT/JP2019/001018, filed Jan. 16, 2019, which is incorporated herein reference and which claimed priority to Japanese Application No. 2018-007455, filed Jan. 19, 2018. The present application likewise claims priority under 35 U.S.C. § 119 to Japanese Application No. 2018-007455, filed Jan. 19, 2018 the entire content of which is also incorporated herein by reference.

BACKGROUND

1. Technical Field

The present disclosure relates to a touch input device using a resistive film.

2. Description of the Related Art

It has become a mainstream in electronic apparatuses, such as smartphones, tablet terminals, laptop or portable audio apparatuses, digital still cameras, game machines, and car navigation apparatuses, to include an input device that allows a user to operate these electronic apparatuses by touching the input device with fingers. As such an input device, there is a known resistive touch panel (touch sensor) (Japanese Patent Application (Laid Open) No. 2009-48233).

The resistive touch panel used in a liquid crystal touch panel or the like has two coordinate axes and can acquire an X coordinate and a Y coordinate of a touched point. On the other hand, the resistive touch panel can be utilized as a simple switch or an input device having only one coordinate axis.

In a case where one resistive touch panel can be divided into a plurality of regions and different functions can be allocated to the respective regions, it is expected that application of the resistive touch panel is further widened.

SUMMARY

The present disclosure is made in view of a situation described above.

An embodiment of the present disclosure relates to a control circuit of a two-wire resistive touch panel. The resistive touch panel includes a first region and a second region which are adjacent to each other in a coordinate axis direction, and the first region has resistance per unit length lower than resistance per unit length of the second region. The control circuit includes: a measurement unit that measures an electric signal having a correlation with impedance between two wires which are lead out from the resistive touch panel; and a processing unit that (i) determines that the first region is touched when the electric signal or impedance obtained from the electric signal is included in a predetermined first range, (ii) determines that the second region is touched when the electric signal or the impedance obtained from the electric signal is included in a predetermined second range, and generates a touched coordinate.

A different embodiment of the present disclosure relates to a control circuit of a three-wire resistive touch panel. The resistive touch panel includes a first region and a second region which are adjacent to each other in a coordinate axis direction, and the first region and the second region have different levels of resistance per unit length. The control circuit includes: a measurement unit that measures a voltage of a sensing wire in a state of applying a predetermine the voltage to the resistive touch panel; and a processing unit that (i) determines that the first region is touched when the voltage of the sensing wire is included in a predetermined first range, (ii) determines that the second region is touched when the voltage of the sensing wire is included in a predetermined second range, and generates a touched coordinate.

Another different embodiment of the present disclosure is a control circuit of a two-wire resistive touch panel. The control circuit includes: a measurement unit that measures impedance between two wires which are lead out from the resistive touch panel; a processing unit that generates a touched coordinate on the basis of impedance; and a two-point touch detector that detects a two-simultaneous touch. When the two-simultaneous touch is detected, output of the calculator is invalidated.

Still another different embodiment of the present disclosure is a control circuit of a three-wire resistive touch panel. The control circuit includes: a measurement unit that measures a voltage of a sensing wire in a state of applying a predetermined voltage to the resistive touch panel; a calculator that generates a touched coordinate on the basis of the voltage of the sensing wire; and a two-point touch detector that detects a two-simultaneous touch. When the two-simultaneous touch is detected, output of the calculator is invalidated.

It is to be noted that any arbitrary combination or rearrangement of the above-described structural components and so forth is effective as and encompassed by the present embodiments. Moreover, this summary of the disclosure does not necessarily describe all necessary features so that the disclosure may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

The disclosure will now be described based on preferred embodiments which do not intend to limit the scope of the present disclosure but exemplify the disclosure. All of the features and the combinations thereof described in the embodiment are not necessarily essential to the disclosure.

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

In the present specification, "a state where a member A is coupled to a member B" includes not only a case where the member A is physically directly coupled to the member B but also a case where the member A and member B are indirectly coupled via another member that does not substantially affect an electric coupling state therebetween or does not impair functions and effects provided by coupling the members.

Similarly, a state represented by "a member C is provided between the member A and the member B" includes not only a case where the member A is directly coupled to the member C or the member B is directly coupled to the member C but also a case where the member A is indirectly coupled to the member C or the member B is indirectly coupled to the member C via another member that does not substantially affect an electric connection state therebetween and does not impair functions and effects provided by coupling the members.

First, a principle of three-wire and two-wire resistive touch panels will be described.

Three-Wire Resistive Touch Panel

Figure 1:
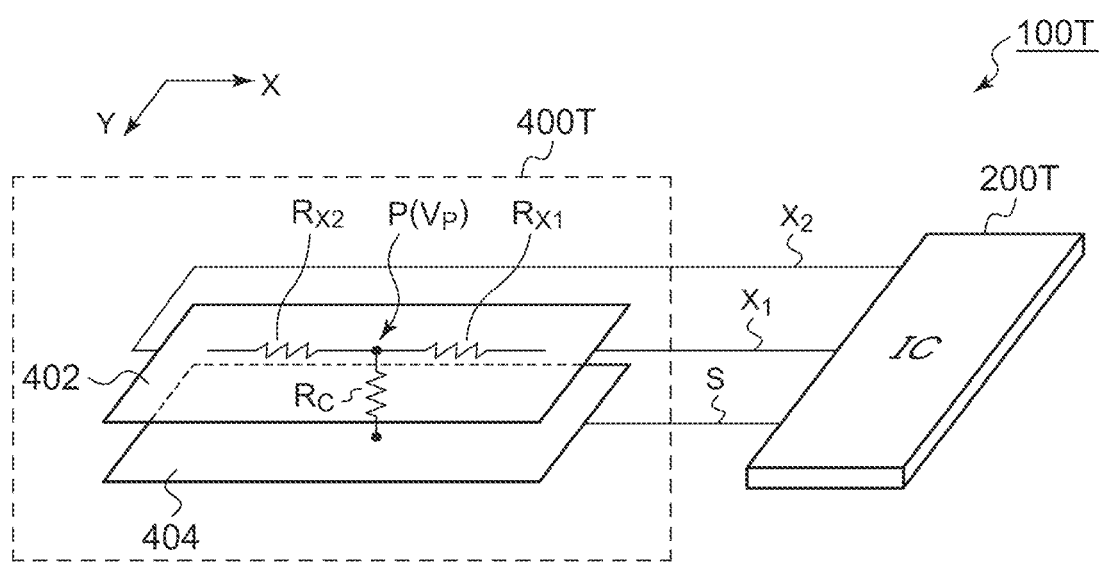
FIG. 1 is a diagram illustrating a principle of a three-wire resistive touch panel.

FIG. 1 is a diagram illustrating a principle of a three-wire resistive touch panel 400T. The three-wire resistive touch panel 400T includes two sheets 402 and 404, wires $X_1$ and $X_2$ drawn from two facing sides of the sheet 402 respectively, and a sensing wire S drawn from the sheet 404.

When a user touches a point P, the two sheets 402 and 404 contact each other at the point (hereinafter referred to as a contact point) P. A control circuit 200T applies: a predetermined power supply voltage (first fixed voltage) $V_{DD}$ to one of the two wires $X_1$ and $X_2$ of the sheet 402; and a ground voltage (second fixed voltage) $V_{GND}$ (=0 V) to the other wire thereof. A voltage $V_P$ at the contact point P is represented by Expression (1).

$$V_P = V_{DD} \times R_{X2}/(R_{X1}+R_{X2}) \quad (1)$$

A resistance value $R_{X1}$ is a resistance value between the contact point P and one end of the sheet 402, and a resistance value $R_{X2}$ is a resistance value between the contact point P and the other end of the sheet 402. $R_{X1}+R_{X2}$ is a resistance value across the sheet 402 and is a constant. $R_C$ represents contact resistance.

Assuming that the sensing wire S on the sheet 404 side has high impedance, the voltage $V_P$ at the contact point P is generated in the sensing wire S. The control circuit 200T determines the resistance value $R_{X2}$, that is, an X coordinate by measuring the voltage $V_P$ at the sensing wire S.

The sheet 404 may also be a conductor.

Two-Wire Resistive Touch Panel

Figure 2:
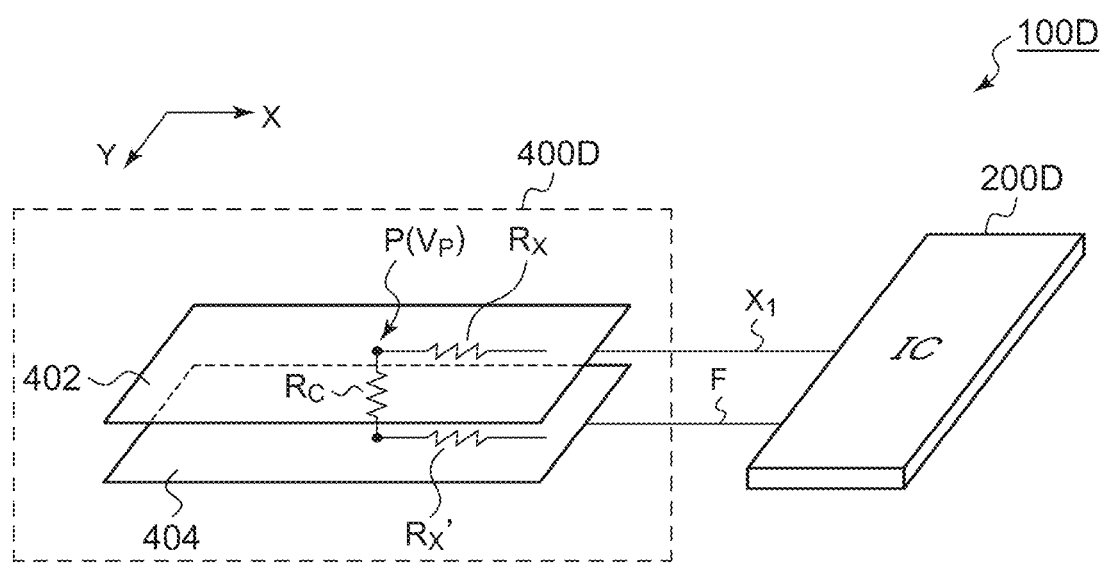
FIG. 2 is a diagram illustrating a principle of a two-wire resistive touch panel.

FIG. 2 is a diagram illustrating a principle of a two-wire resistive touch panel 400D. The two-wire resistive touch panel 400D includes two sheets 402 and 404, a wire X drawn from one side of the sheet 402, and a wire F drawn from the sheet 404.

To detect an X coordinate, the control circuit 200T measures impedance Z (referred to as the panel impedance) in a path from the wire X to the wire F via a contact point P.

$$Z = R_X + R_C + R_X'$$

Since both $R_X$ and $R_X'$ are linearly changed with respect to the X coordinate and $R_C$ is a constant, the panel impedance Z is represented by a linear function of the X coordinate, and the linear function is known. Therefore, the X coordinate corresponding to the panel impedance Z can be detected by measuring the panel impedance Z. Note that the sheet 404 may also be a metal conductor, and in this case, $R_X'=0$ is established.

Next, touch input devices 100A to 100D respectively using the above-described two-wire/three-wire resistive touch panels will be described on the basis of some embodiments.

First Embodiment

Figure 3:
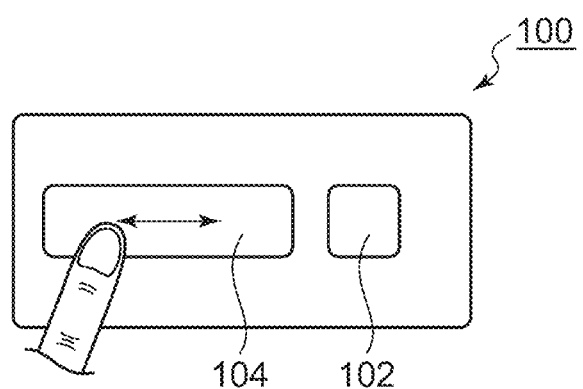
FIG. 3 is a view illustrating a touch input device according to a first embodiment.

FIG. 3 is a diagram illustrating a touch input device 100A according to a first embodiment. The touch input device 100A is a multi-function panel provided with a button (switch) 102 and a slider input unit 104. The present embodiment provides a technology in which such a touch input device is implemented by one resistive touch panel and a controller thereof.

Figure 4:
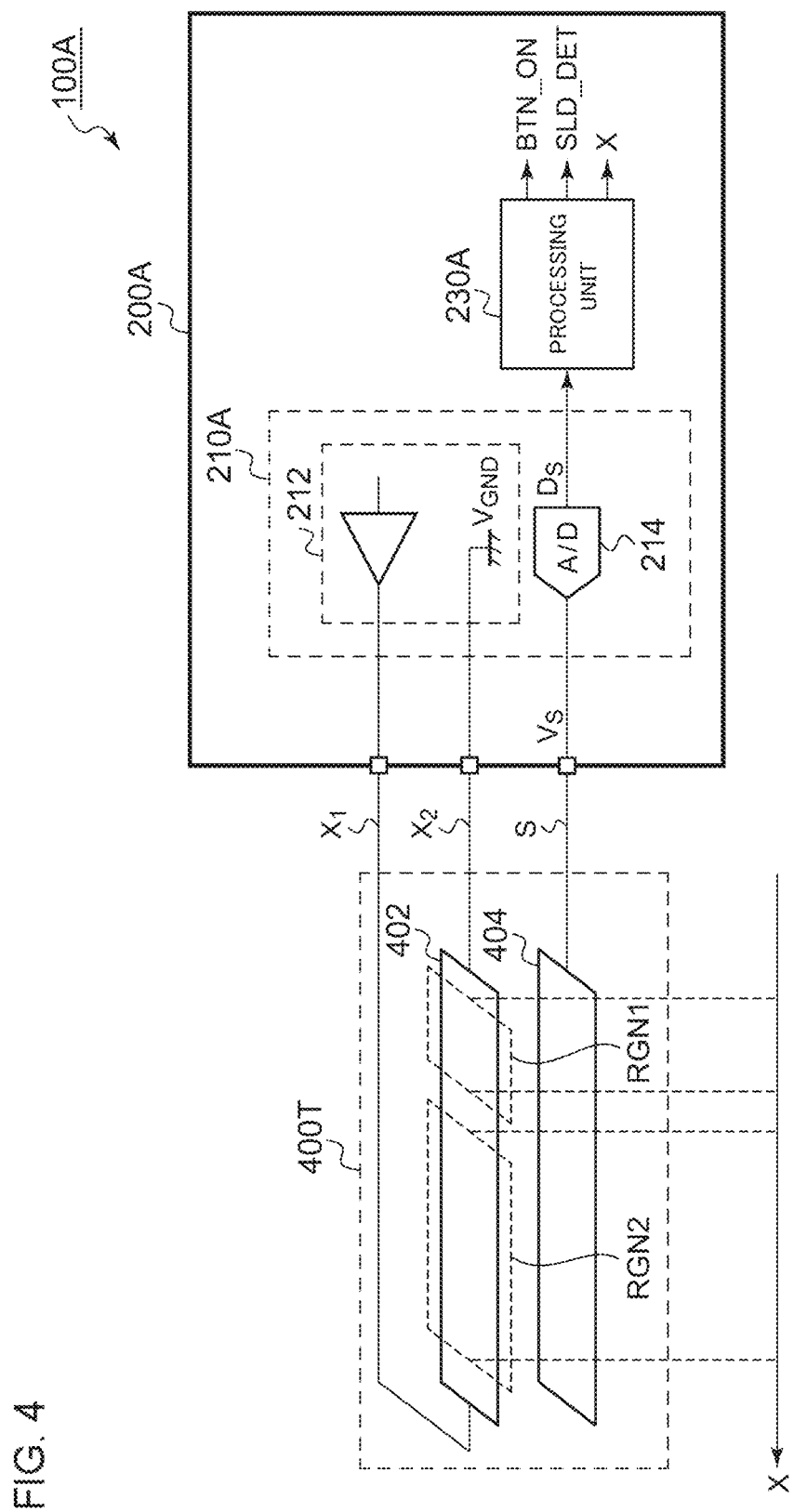
FIG. 4 is a block diagram of the touch input device according to the first embodiment.

FIG. 4 is a block diagram of the touch input device 100A according to the first embodiment. The touch input device 100A includes a three-wire resistive touch panel 400T and a control circuit 200A thereof.

The control circuit 200A includes a measurement unit 210A and a calculator 230A. The measurement unit 210A applies a predetermined voltage between two wires $X_1$ and $X_2$ of the three-wire resistive touch panel 400T. Then, the measurement unit 210A measures a voltage (sense voltage) $V_S$ of a sensing wire S in this state. For example, the measurement unit 210A includes a driver circuit 212 and an A/D converter 214. The driver circuit 212 may apply a predetermined power supply voltage $V_{DD}$ to a first wire $X_1$ and a ground voltage $V_{GND}$ (0 V) to the second wire $X_2$. The A/D converter 214 converts the sense voltage $V_S$ into a digital value $D_S$. An amplifier may also be provided in a pre-stage of the A/D converter 214.

The calculator 230A generates a coordinate X of a contact point on the basis of the sense voltage $V_S$. FIG. 4 illustrates a region RGN1 corresponding to the button 102 of FIG. 3 and a region RGN2 corresponding to the slider input unit 104. The calculator 230A determines that the button 102 is pressed when the detected X coordinate is included in the region RGN1. Additionally, the calculator 230A determines that the slider input unit 104 is pressed when the detected X coordinate is included in the region RGN2.

When a distance between the two regions RGN1 and RGN2 is sufficiently wide, whether input is made to the button 102 or the slider input unit 104 can be discriminated by the above-described processing. However, when the button 102 and the slider input unit 104 are located close to each other and a sufficient space cannot be secured between the two regions RGN1 and RGN2, it is difficult to discriminate whether the input is made to the button 102 or the slider input unit 104. For example, even in a case where touch input is made to the region RGN1, the touch input may be erroneously determined as the input to the region RGN2 due to influence of noise. Also, in a case where the space is narrower than a width of a finger, the detected X coordinate may reciprocate between the regions RNG1 and RGN2 depending on a position of the finger, erroneous operation may be caused.

Such problems can be solved by combining a three-wire resistive touch panel 400T of FIG. 5 described below with the control circuit 200A according to the embodiment.

Figure 5:
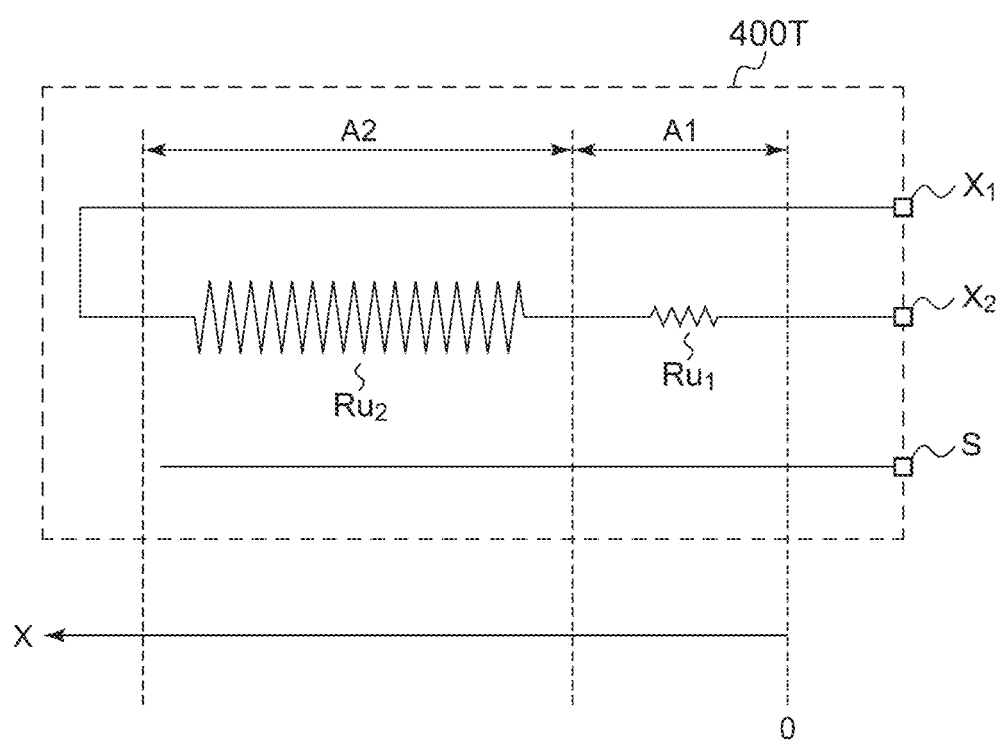
FIG. 5 is an equivalent circuit diagram of a three-wire resistive touch panel according to an example.

FIG. 5 is an equivalent circuit diagram of the three-wire resistive touch panel 400T according to an example. The three-wire resistive touch panel 400T includes a first region (low resistance region) A1 and a second region (high resistance region) A2 which are adjacent to each other in a coordinate axis (X) direction, and the first region A1 and the second region A2 are formed to have different levels of resistance per unit length. The first region A1 is a region corresponding to the button 102, the second region A2 is a region corresponding to the slider input unit 104, and a resistance value $Ru_1$ per unit length of the first region A1 is sufficiently lower than a resistance value Rue per unit length of the second region A2. Each of the resistance values Ru has a Ω/m dimension.

$$Ru_1 << Ru_2$$

Note that a direction of an X coordinate and a method of setting an origin thereof are merely examples.

Figure 6:
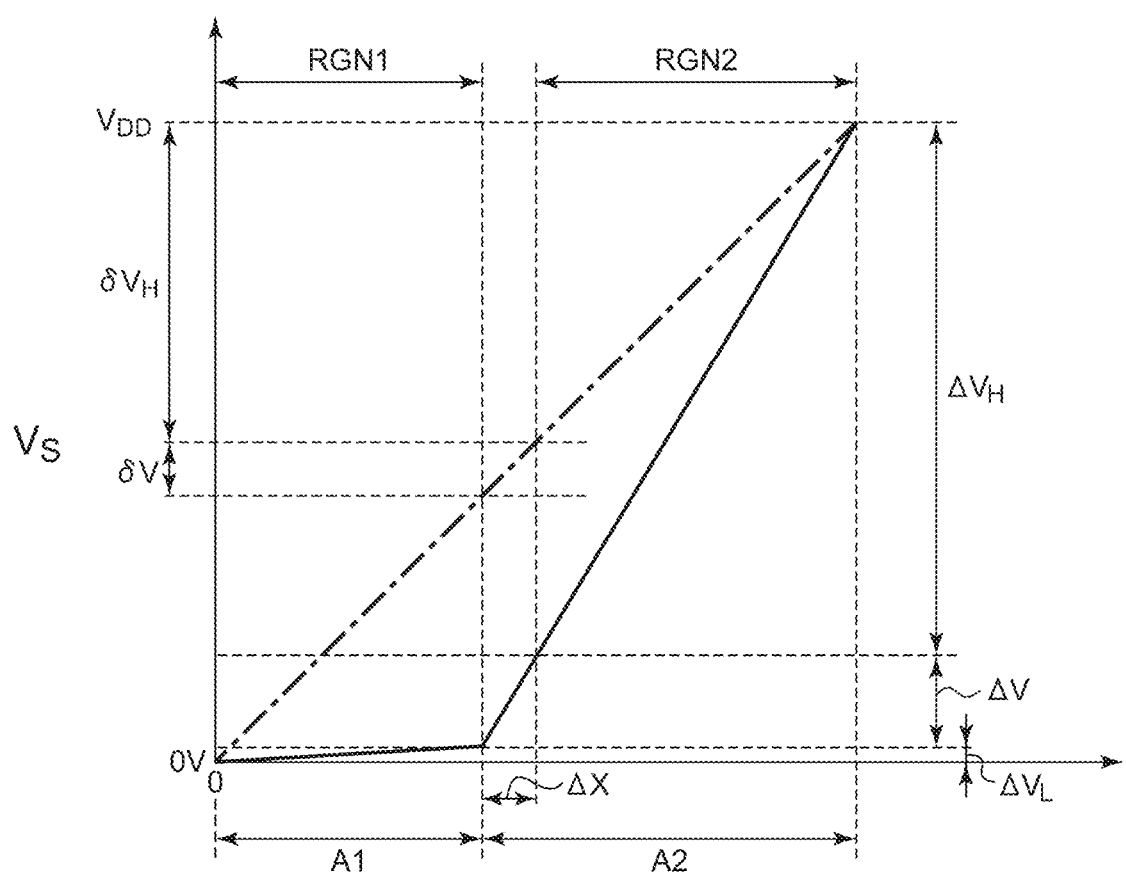
FIG. 6 is a diagram illustrating a relation between a coordinate X of a contact point and a sense voltage $V_S$ at the time of using the three-wire resistive touch panel of FIG. 5.

FIG. 6 is a diagram illustrating a relation between a coordinate X of a contact point and the sense voltage $V_S$ at the time of using the three-wire resistive touch panel 400T of FIG. 5. A relation obtained in a conventional panel having uniform impedance distribution is indicated by a dash-dot-dash line for comparison.

Operation at the time of using the conventional panel will be described with reference to the dash-dot-dash line in order to clarify advantages of the three-wire resistive touch panel of FIG. 5. In the conventional panel, the sense voltage $V_S$ is changed in a constant slope with respect to the coordinate X in an entire range. Specifically, assuming that a resistance value per panel unit length is $Ru_3$, the slope becomes $Ru_3$.

$$V_S \approx Ru_3 \times X$$

Assume that the two regions RGN1 and RGN2 are defined as illustrated in the drawing and a space (dead zone) ΔX exists therebetween. In the conventional panel, δV is to be a voltage range corresponding to the space.

$$\delta V = \Delta X \times Ru_3$$

Next, advantages of the three-wire resistive touch panel of FIG. 5 will be described with reference to a solid line. In the first region A1, since the resistance value $Ru_1$ per unit length is extremely small, sensitivity of the sense voltage $V_S$ with respect to the coordinate X is extremely small. Instead, a slope of the sense voltage $V_S$ in the second region A2 can be made larger than a slope of the dash-dot-dash line. In the three-wire resistive touch panel of FIG. 5, ΔV is to be a voltage range corresponding to the space.

$$\Delta V = \Delta X \times Ru_2$$

Here, when a relation $Ru_1 < Ru_3 < Ru_2$ is established, ΔV>δV can be achieved. That is, the voltage range corresponding to the dead zone is expanded. This means that in a case where the space between the button 102 and the slider input unit 104 is narrow, it becomes easy to determine whether input is made to the button 102 or the slider input unit 104.

Furthermore, with the use of the three-wire resistive touch panel of FIG. 5, a voltage range $\Delta V_H$ of the sense voltage $V_S$ corresponding to the region RGN2 can be expanded more than a voltage range $\delta V_H$ of the conventional panel. Consequently, accuracy of coordinate detection in the slider input unit 104 can be improved.

Refer to FIG. 4 again. The calculator 230A determines that (i) the button 102 corresponding to the first region A1 is touched when the sense voltage $V_S$ is included in a predetermined first range (a voltage range $\Delta V_L$ on a zero V side in FIG. 6). At this time, the calculator 230A may assert first output BTN_ON (1 or high, for example).

Additionally, the calculator 230A determines that (ii) the slider input unit 104 corresponding to the second region A2 is touched when the voltage $V_S$ of the sensing wire is included in a predetermined second range (the voltage range $\Delta V_H$ on the predetermined power supply voltage $V_{DD}$ side in FIG. 6). The calculator 230A asserts second output SLD_DET (1 or high, for example) and acquires a touched coordinate X to output a touched coordinate X.

Consequently, it is possible to easily and surely discriminate the input to the button 102 from the input to the slider input unit 104.

Second Embodiment

Figure 7:
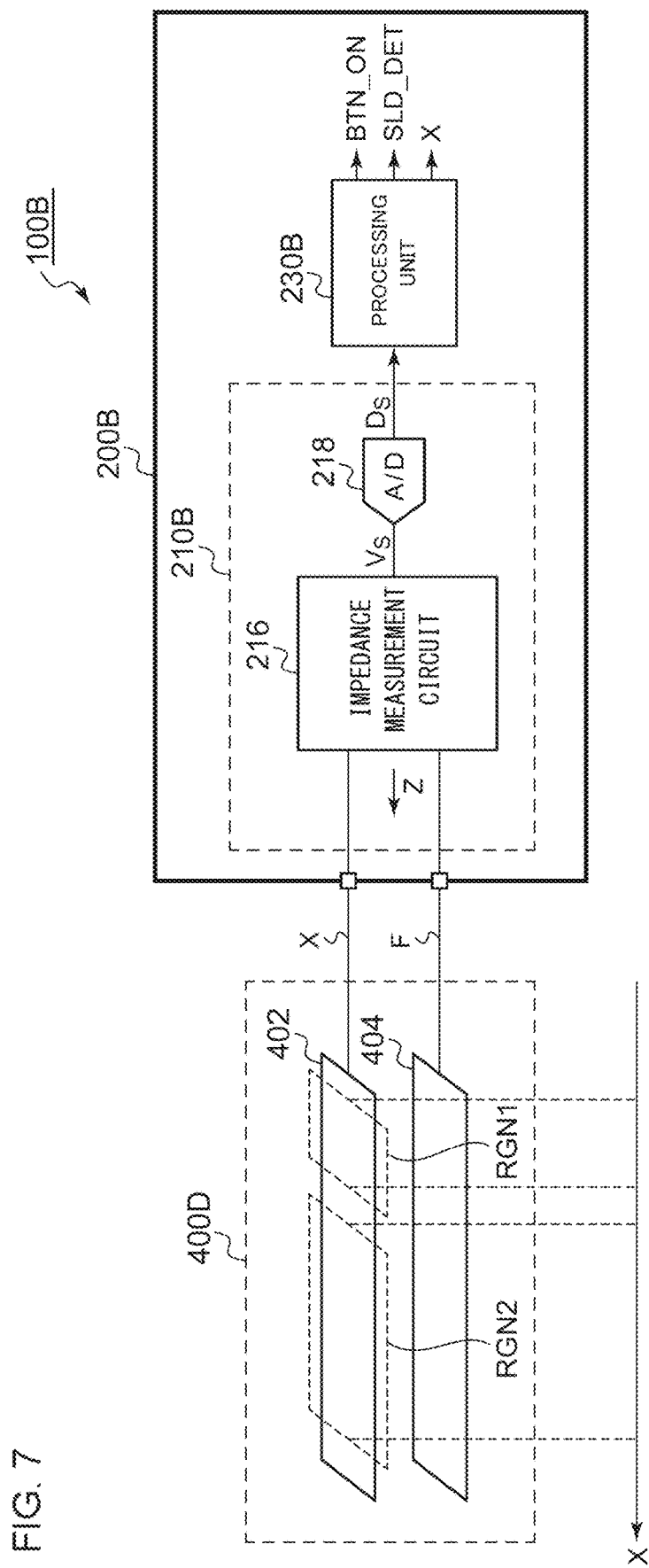
FIG. 7 is a block diagram of a touch input device according to a second embodiment.

FIG. 7 is a block diagram of a touch input device 100B according to a second embodiment. The touch input device 100B includes a two-wire resistive touch panel 400D and a control circuit 200B thereof. Similar to a first embodiment, the second embodiment also provides a multi-function panel illustrated in FIG. 3.

The control circuit 200B includes a measurement unit 210B and a calculator 230B. The measurement unit 210B is capable of measuring an electric signal (sense signal $V_S$) having a correlation with panel impedance Z between two wires X and S of the two-wire resistive touch panel 400D. The calculator 230B includes an impedance measurement circuit 216 and an A/D converter 218. The impedance measurement circuit 216 generates the sense signal $V_S$ having the correlation with the panel impedance between the two wires X and S.

The A/D converter 218 converts the sense signal $V_S$ into a digital value $D_S$. The calculator 230B receives the digital value $D_S$ of the measured sense signal, also determines whether input is made to a button 102 or a slider input unit 104, and outputs a coordinate X in a case where the input is made to the slider input unit 104. Similar to a calculator 230A of FIG. 5, the calculator 230B can output BTN_ON, SLD_DET, and X.

Figure 8A:
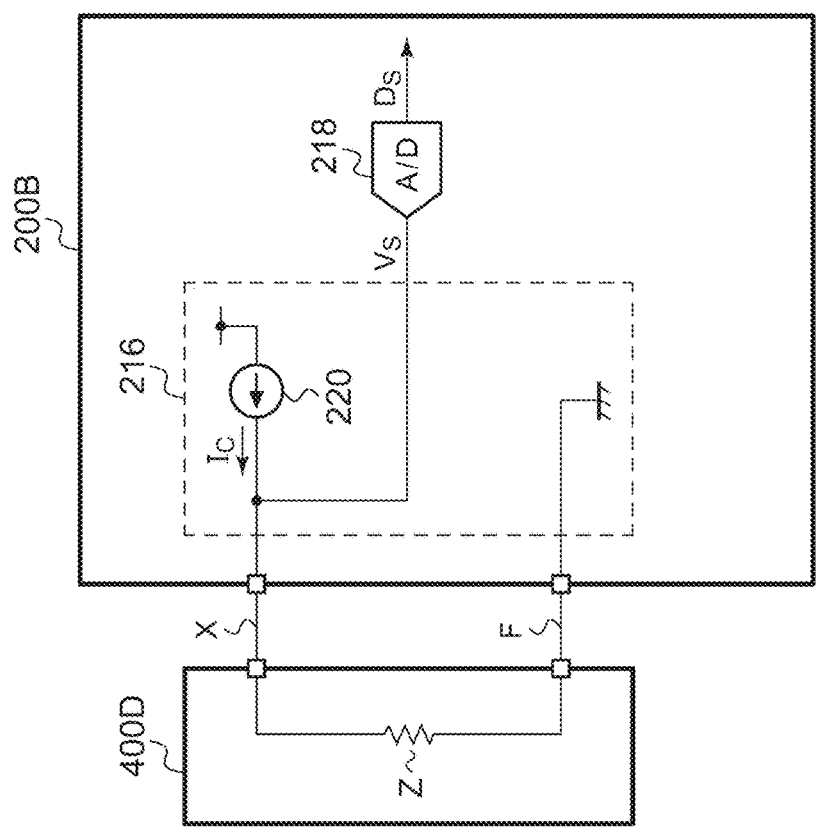
FIG. 8A and FIG. 8B are circuit diagrams each illustrating an exemplary configuration of a measurement unit.
Figure 8B:
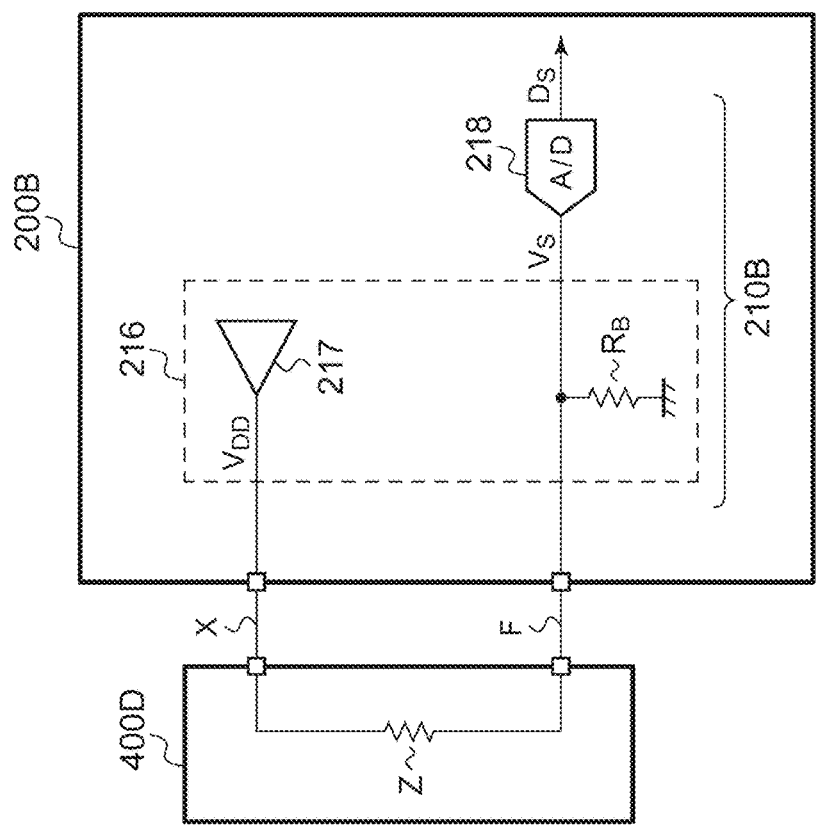

FIG. 8A and FIG. 8B are circuit diagrams each illustrating an exemplary configuration of the measurement unit 210B.

In the measurement unit 210B of FIG. 8A, the impedance measurement circuit 216 includes a resistor $R_B$ and a voltage source 217. The resistor $R_B$ is connected to two-wire resistive touch panel 400D in series. The voltage source 217 applies a predetermined power supply voltage $V_{DD}$ across the series connection of the two-wire resistive touch panel 400D and the resistor $R_B$.

The sense voltage $V_S$ at a connection node between the two-wire resistive touch panel 400D and the resistor $R_B$ (that is, voltage drop at the resistor $R_B$) is received as a sense signal in the A/D converter 218. The sense signal $V_S$ at this time is represented by Expression below and has the correlation with the panel impedance Z of the two-wire resistive touch panel 400D.

$$V_S = V_{DD} \times R_B / (Z + R_B)$$

As described above, since the panel impedance Z of the two-wire resistive touch panel 400D has a one-to-one correspondence with the coordinate X, the measured sense signal $V_S$ also has a one-to-one correspondence with the coordinate X.

Note that the voltage drop of the two-wire resistive touch panel 400D may also be deemed as the sense signal. The sense signal $V_S$ at this time is represented by Expression below and has the correlation with the panel impedance Z of the two-wire resistive touch panel 400D.

$$V_S = V_{DD} \times Z / (Z + R_B)$$

In the measurement unit 210B of FIG. 8B, the impedance measurement circuit 216 includes a current source 220. The current source 220 supplies constant electric current $I_C$ to the two-wire resistive touch panel 400D. The A/D converter 218 measures voltage drop at the two-wire resistive touch panel 400D as the sense signal $V_S$. The sense signal $V_S$ at this time is represented by Expression below and has a correlation with the panel impedance Z of the two-wire resistive touch panel 400D. Specifically, the sense signal $V_S$ is proportional to the panel impedance Z.

$$V_S = I_C \times Z$$

Note that an amplifier may also be provided at an input side of the A/D converter 218.

Figure 9:
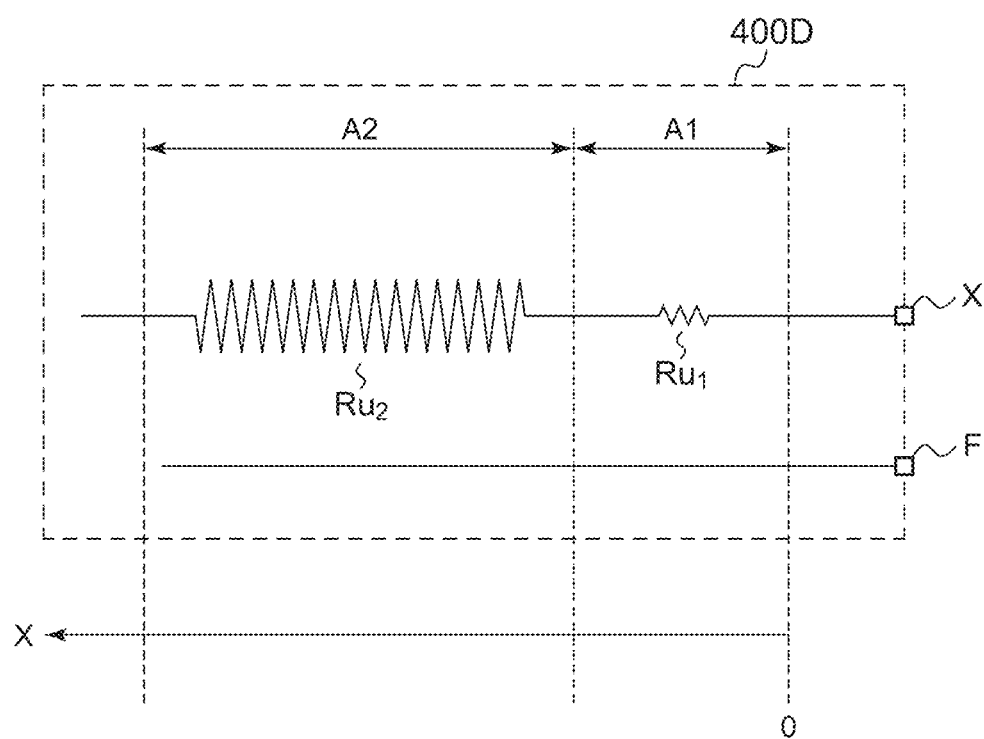
FIG. 9 is an equivalent circuit diagram of a two-wire resistive touch panel according to an example.

FIG. 9 is an equivalent circuit diagram of the two-wire resistive touch panel 400D according to an example. Similar to a three-wire resistive touch panel 400T of FIG. 5, the two-wire resistive touch panel 400D has non-uniform impedance distribution. Specifically, the two-wire resistive touch panel 400D includes a first region (low resistance region) A1 and a second region (high resistance region) A2 which are adjacent to each other in a coordinate axis (X) direction, and the first region A1 and the second region A2 are formed to have different levels of resistance per unit length. The first region A1 is a region corresponding to the button 102, the second region A2 is a region corresponding to the slider input unit 104, and a resistance value $Ru_1$ per unit length of the first region A1 is sufficiently lower than a resistance value Rue per unit length of the second region A2.

$$Ru_1 << Ru_2$$

Note that a direction of an X coordinate and a method of setting an origin thereof are merely examples.

Figure 10:
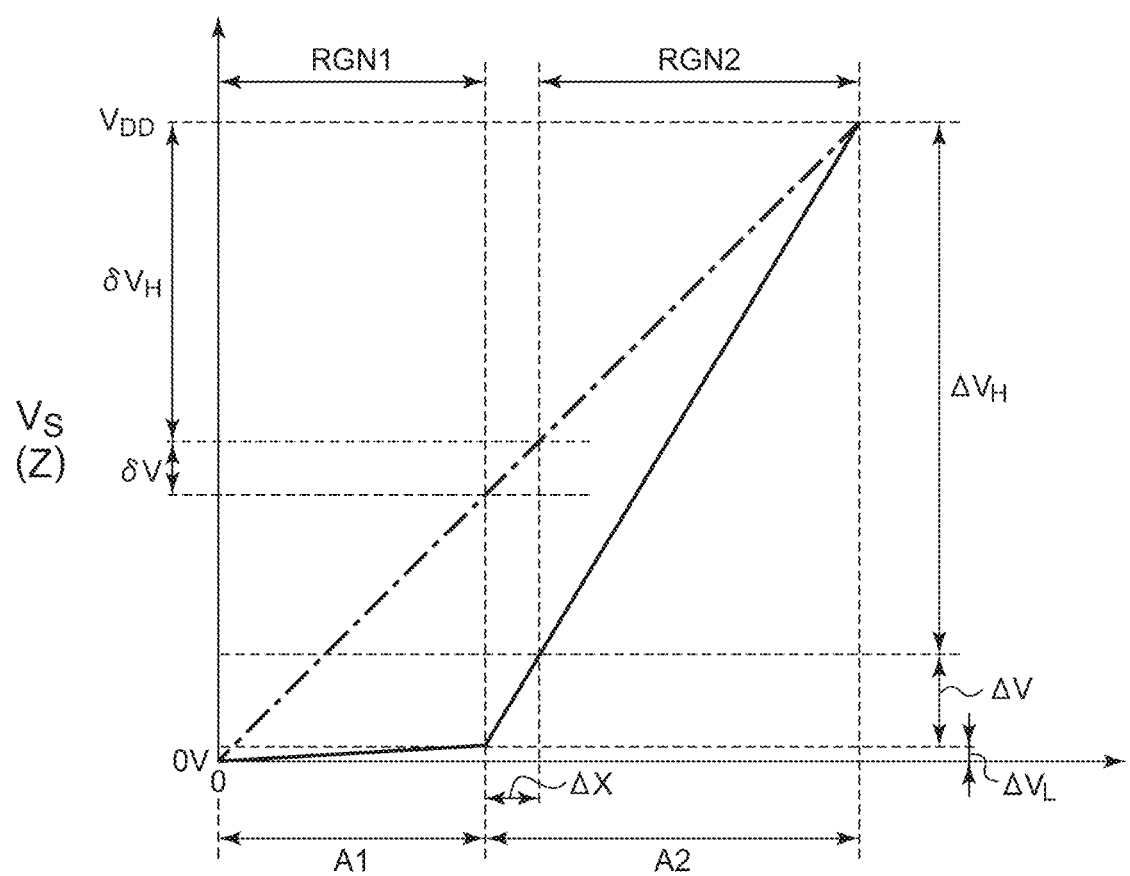
FIG. 10 is a diagram illustrating a relation between a coordinate X of a contact point and panel impedance Z at the time of using the two-wire resistive touch panel of FIG. 9.

FIG. 10 is a diagram illustrating a relation between a coordinate X of a contact point and the panel impedance Z at the time of using the two-wire resistive touch panel 400D of FIG. 9. A relation obtained in a conventional panel having uniform impedance distribution is indicated by a dash-dot-dash line for comparison. Here, assume that the sense signal $V_S$ is proportional to the panel impedance Z for easy understanding and easy description.

Next, advantages of the two-wire resistive touch panel of FIG. 9 will be described with reference to a solid line. In the first region A1, since the resistance value $Ru_1$ per unit length is extremely small, sensitivity of the sense signal $V_S$ (panel impedance Z) with respect to the coordinate X is extremely small. Instead, a slope of the sense signal $V_S$ (panel impedance Z) in the second region A2 can be made larger than a slope of the dash-dot-dash line. In the two-wire resistive touch panel of FIG. 9, $\Delta V$ is to be a voltage range corresponding to a space.

$$\Delta V = \Delta X \times Ru_2$$

Similar to the description of the three-wire resistive touch panel, when a relation of $Ru_1 < Ru_3 < Ru_2$ is established, $\Delta V > \delta V$ can be achieved. That is, the voltage range corresponding to a dead zone is expanded. Due to this, even in a case where the space between the button 102 and the slider input unit 104 is narrow, it also becomes easy to discriminate whether the input is made to the button 102 or the slider input unit 104.

Furthermore, a voltage range $\Delta V_H$ of the sense voltage $V_S$ corresponding to the region RGN2 can be expanded more than a voltage range $\delta V_H$ of the conventional panel by using the two-wire resistive touch panel of FIG. 9. Consequently, accuracy of coordinate detection in the slider input unit 104 can be improved.

Refer to FIG. 7 again. The calculator 230B determines that (i) the first region RGN1 is touched when the digital value $D_S$ (the sense signal $V_S$) or the panel impedance Z obtained therefrom is included in the predetermined first range (voltage range $\Delta V_L$ in FIG. 10).

Also, the calculator 230B determines that (ii) the second region RGN2 is touched when the sense signal $V_S$ or the panel impedance Z obtained therefrom is included in the predetermined second range (voltage range $\Delta V_H$ in FIG. 10), and generates the touched coordinate X.

Thus, according to the second embodiment also, the effects similar to those of the first embodiment can be obtained.

In the above, the cases where the three-wire resistive touch panel 400T and two-wire resistive touch panel 400D each having a straight shape have been described above, but the three-wire resistive touch panel 400T and two-wire resistive touch panel 400 are not limited thereto and may have a curved shape or a bent shape in a plane. In this case, the X axis can be defined along a panel extending direction. Hereinafter, such a panel will be referred to as a curved panel.

Figure 11A:
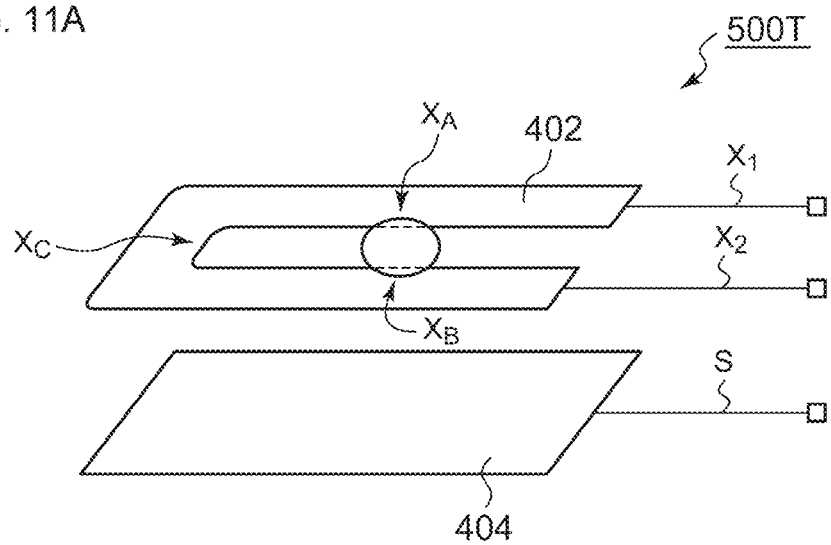
FIG. 11A and FIG. 11B are plan views illustrating curved panels respectively.
Figure 11B:
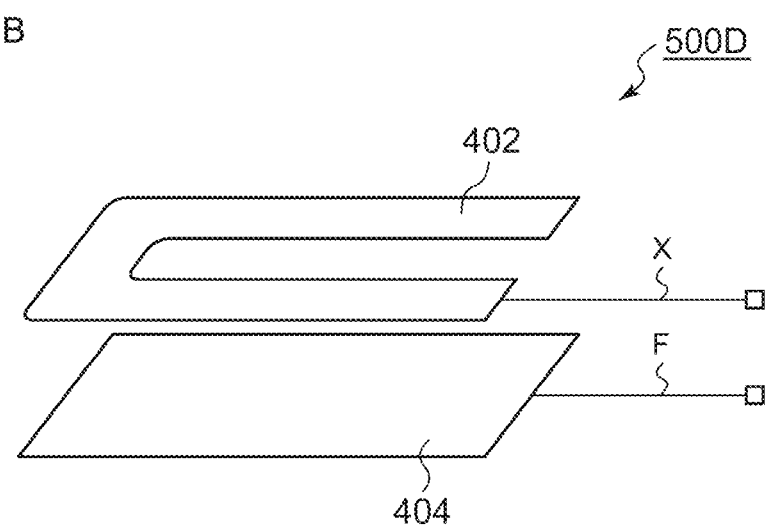

FIG. 11A and FIG. 11B are plan views illustrating curved panels 500T and 500D respectively. The curved panel 500T in FIG. 11A is a three-wire touch panel. A sheet 402 including two wires $X_1$ and $X_2$ is curved in a U shape. A sheet 404 including a sensing wire S may have any shape.

A curved panel 500D in FIG. 11B is a two-wire curved panel. In a case of the two-wire curved panel 500D, the sheet 404 may have any shape in a case where the sheet 404 including the sensing wire is a conductor. In a case where the sheet 404 includes a resistive film, the two sheets 402 and 404 may overlap with each other and have the same shape.

The curved panels 500T and 500D in FIG. 11A and FIG. 11B are curved in a plane such that two places (two regions) having different coordinates are located close to each other.

A problem that may occur in such panels will be described. In such panels, the two places ($X_A$ and $X_B$) having different coordinates may be simultaneously touched as illustrated in FIG. 11A. In this case, a coordinate generated by the calculator is located at a coordinates $X_C$ near a midpoint therebetween, and correct user input cannot be detected. In third and fourth embodiments, a control circuit that can solve such a problem will be described.

Third Embodiment

Figure 12:
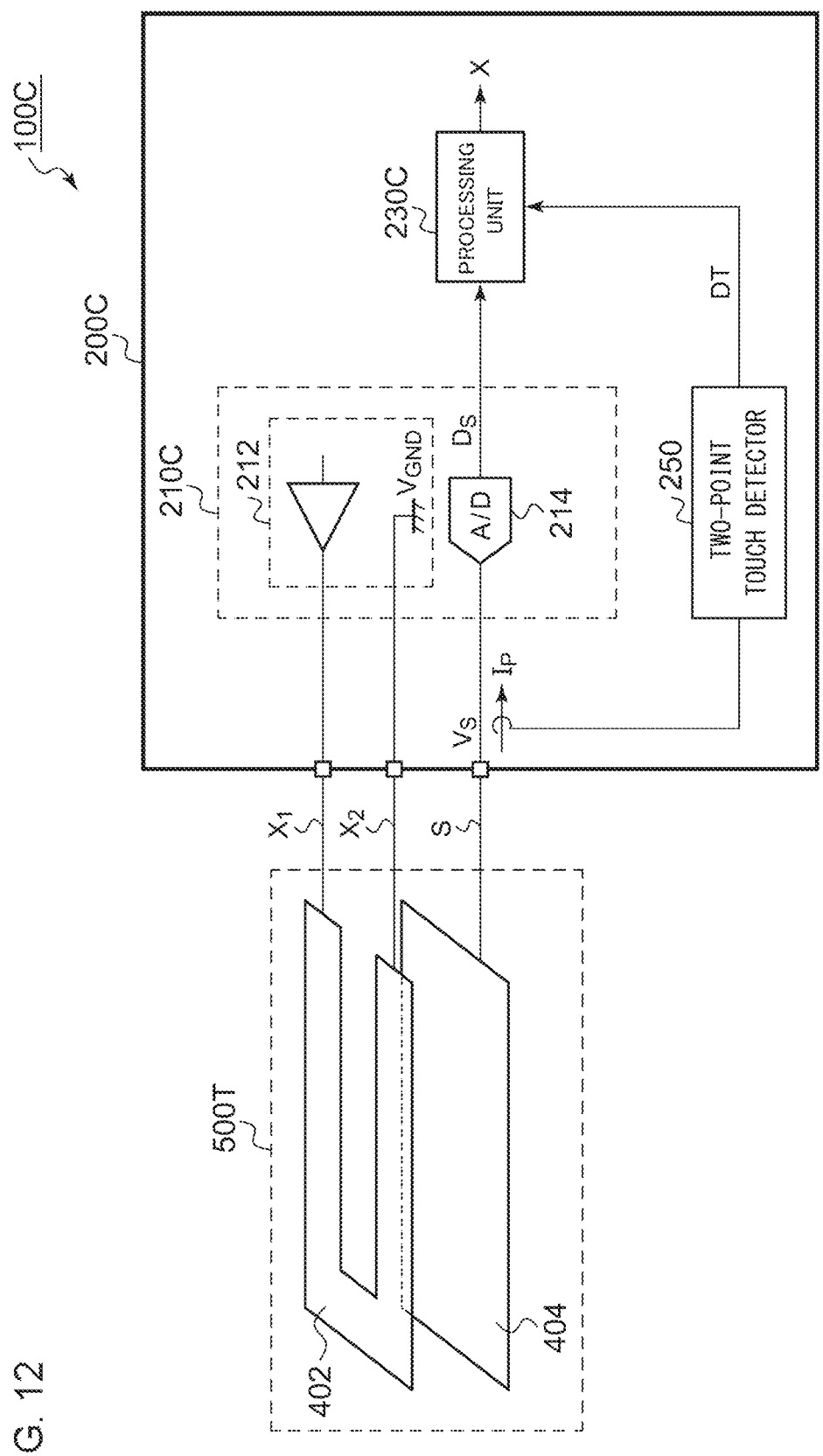
FIG. 12 is a block diagram of a touch input device according to a third embodiment.

FIG. 12 is a block diagram of a touch input device 100C according to a third embodiment. The touch input device 100C includes a three-wire curved panel 500T and a control circuit 200C. The control circuit 200C includes a two-point touch detector 250 in addition to a measurement unit 210C and a calculator 230C.

The measurement unit 210C can have a configuration similar to that of a measurement unit 210A already described above. The calculator 230C determines a coordinate on the basis of a sense voltage $V_S$.

The two-point touch detector 250 generates a two-point touch detection signal DT indicating whether or not two points are simultaneously touched. Note that a technology disclosed in Japanese Patent No. 5086394 can be used to detect whether or not the two-simultaneous touch is performed. More specifically, the two-point touch detector 250 can determine a distance between two points on the basis of panel electric current $I_P$ flowing through the curved panel 500T. Note that the method of detecting a two-point touch is not limited thereto and another method may also be used.

In the touch input device 100C, when the two-point touch detection signal DT indicates that the two points are simultaneously touched, output of the calculator 230C (i.e., an X coordinate) is invalidated.

According to the touch input device 100C, it is possible to prevent erroneous determination of a coordinate in the event of the two-simultaneous touch on the curved panel 500T.

Fourth Embodiment

Figure 13:
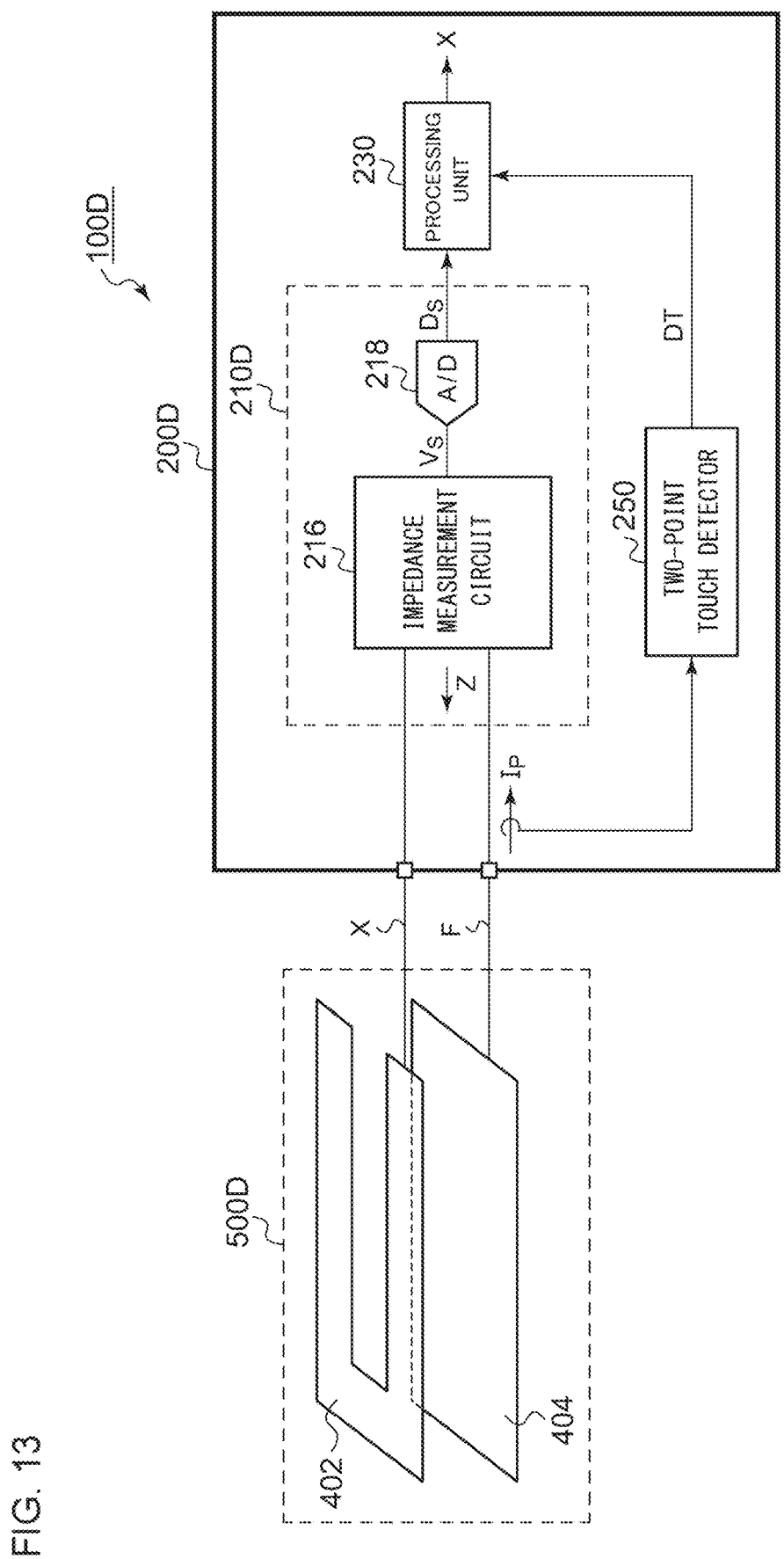
FIG. 13 is a block diagram of a touch input device according to a fourth embodiment.

FIG. 13 is a block diagram of a touch input device 100D according to a fourth embodiment. The touch input device 100D includes a two-wire curved panel 500D and a control circuit 200D. The control circuit 200D includes a two-point touch detector 250 in addition to a measurement unit 210D and a calculator 230D.

The measurement unit 210D can have a configuration similar to that of a measurement unit 210B already described above. The calculator 230D determines a coordinate on the basis of a sense voltage $V_S$.

The two-point touch detector 250 generates a two-point touch detection signal DT indicating whether or not two points are simultaneously touched. In the touch input device 100D, when the two-point touch detection signal DT indicates that the two points are simultaneously touched, output of the calculator 230D (i.e., an X coordinate) is invalidated.

According to this touch input device 100D, it is possible to prevent erroneous determination of a coordinate in the event of a two-simultaneous touch on the curved panel 500D.

In the above, the present disclosure has been described on the basis of the embodiments. Note that the embodiments are examples and it should be understood by those skilled in the art that: various modified examples can be achieved by combining the respective constituent elements and the processes of the processing thereof; and such modified examples are also included in the scope of the present disclosure. Hereinafter, such modified examples will be described.

First Modified Example

The first embodiment and the third embodiment can be combined. Furthermore, the second embodiment and the fourth embodiment may also be combined.

Second Modified Example

In the first and second embodiments, the resistance value $Ru_1$ per unit length on the button 102 side is made small and the resistance value $Ru_2$ on the slider input unit 104 side is made large, respectively, but not limited thereto. The impedance distribution may be determined in accordance with: a position of a sense signal measured to detect a coordinate: and a measurement method. Specifically, the impedance distribution is to be determined such that position sensitivity of a sense signal is low on the button 102 side and position sensitivity of a sense signal is high on the slider input unit 104 side.

Third Modified Example

Figure 14:
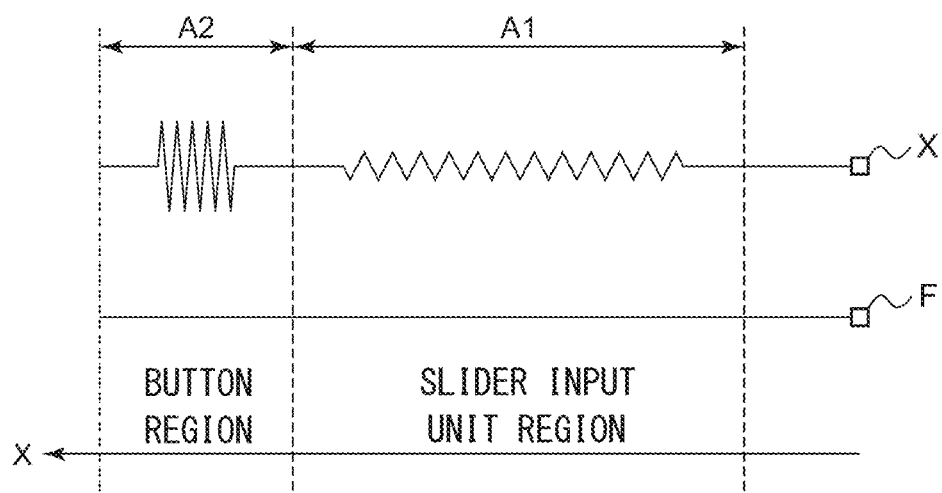
FIG. 14 is a diagram illustrating impedance distribution of a two-wire resistive touch panel according to a modified example.

FIG. 14 is a diagram illustrating impedance distribution of the two-wire resistive touch panel 400D according to the modified example. In this example, the button 102 side is made as a high resistance region and the slider input unit 104 side is made as a low resistance region. In a case of detecting a sense signal $V_S$ by the circuit illustrated in FIG. 8A, such impedance distribution is preferably used.

Fourth Modified Example

In the first and second embodiments, the multifunctional touch input device 100 including the button 102 and the slider input unit 104 has described, but the combination of the functions is not limited thereto.

What is claimed is:

1. A control circuit of a resistive touch panel,
the resistive touch panel including a first sheet and a second sheet which overlap each other and extend in a coordinate axis direction, and the first sheet including a first region and a second region which are adjacent to each other in the coordinate axis direction, wherein resistance per unit length of the first sheet in the first region is higher than resistance per unit length of the first sheet in the second region,
the control circuit comprising:
a measurement unit structured to measure an electric signal being inversely proportional to impedance between a first line which is lead out from one end of the first sheet and a second line which is lead out from one end of the second sheet; and
a processing unit structured to: (i) determine that the first region is touched when the electric signal is included in a predetermined first range; (ii) determine that the second region is touched when the electric signal is included in a predetermined second range; and generate a touched coordinate.

2. The control circuit according to claim 1, wherein
the measurement unit includes:
a resistor connected to the resistive touch panel in series;
a voltage source structured to apply a predetermined voltage across a series connection of the resistive touch panel and the resistor; and
an A/D converter structured to measure a voltage at a connection node between the resistive touch panel and the resistor.

3. The control circuit according to claim 1, wherein
the measurement unit includes:
a current source structured to supply constant electric current to the resistive touch panel; and
an A/D converter structured to measure voltage drop of the resistive touch panel.

4. The control circuit according to claim 1, wherein
the resistive touch panel has a shape that is curved or bent in a plane such that two places having different coordinates are located close to each other,
the control circuit further includes a two-point touch detector structured to generate a two-point touch detection signal indicating whether or not two points are simultaneously touched, and
when the two-point touch detection signal indicates that two points are simultaneously touched, output of the processing unit is invalidated.

5. A touch input device comprising:
a resistive touch panel: and
the control circuit according to claim 1, structured to control the resistive touch panel.

\* \* \* \* \*